(12) United States Patent
Kawamata

(10) Patent No.: US 7,425,896 B2
(45) Date of Patent: Sep. 16, 2008

(54) TAG TESTING DEVICE, TAG TESTING METHOD, AND TAG TESTING PROGRAM

(75) Inventor: Hiroshi Kawamata, Inagi (JP)

(73) Assignees: Fujitsu Limited, Kawasaki (JP); Fujitsu Frontech Limited, Tokyo (JP)

( * ) Notice: Subject to any disclaimer, the term of this patent is extended or adjusted under 35 U.S.C. 154(b) by 143 days.

(21) Appl. No.: 11/283,839

(22) Filed: Nov. 22, 2005

(65) Prior Publication Data

US 2006/0220858 A1 Oct. 5, 2006

(30) Foreign Application Priority Data

Mar. 29, 2005 (JP) .............................. 2005-094504

(51) Int. Cl.
| | |
|---|---|
| G08B 29/00 | (2006.01) |
| G08B 13/14 | (2006.01) |
| G08B 17/00 | (2006.01) |
| G08B 21/00 | (2006.01) |
| G01R 31/00 | (2006.01) |
| G01R 31/08 | (2006.01) |
| G01R 31/28 | (2006.01) |
| G06F 19/00 | (2006.01) |
| G06K 19/06 | (2006.01) |
| G01N 25/00 | (2006.01) |
| G01K 1/16 | (2006.01) |

(52) U.S. Cl. .................. 340/572.1; 340/514; 340/572.1; 340/572.8; 340/584; 340/588; 340/589; 340/655; 340/10.1; 324/500; 324/512; 235/385; 235/492; 374/9; 374/10; 374/11; 374/120; 374/121; 714/25; 714/32

(58) Field of Classification Search .............. 340/572.1, 340/572.8, 514, 584, 588, 589, 655; 324/500, 324/512; 374/9–11, 120–121; 235/385, 235/492; 714/25, 32
See application file for complete search history.

(56) References Cited

U.S. PATENT DOCUMENTS

| | | | | |
|---|---|---|---|---|
| 5,983,363 | A | * 11/1999 | Tuttle et al. | ................... 714/25 |
| 6,104,291 | A | 8/2000 | Beauvillier et al. | |
| 6,111,424 | A | * 8/2000 | Bosacchi | ..................... 324/770 |

(Continued)

FOREIGN PATENT DOCUMENTS

| | | |
|---|---|---|
| JP | 11-307822 | 11/1999 |
| JP | 2003-67676 | 3/2003 |

*Primary Examiner*—George A Bugg
*Assistant Examiner*—Lam P Pham
(74) *Attorney, Agent, or Firm*—Staas & Halsey LLP (57) ABSTRACT

A tag testing device uses an infrared camera to take an image of a plurality of radio frequency identification tags, compares the image with a stored standard tag pattern image storage, and detects defective tags based on the comparison. A radio wave transceiver bulk reads the tags using anti-collision, a tag response counter counts a number of tag responses, and a defective tag detector compares a number of heat emitting tags based upon the image processing with a number of tag responses counted by the tag response counter. If the number of heat emitting tags does not match a number of responsive tags, a number of the tags tested are changed by partially shielding the tags and the radio wave transceiver repeatedly bulk reads the tags using the anti-collision function while a shielding range is gradually changed, thereby narrowing down other possible defective but heat emitting tags.

23 Claims, 8 Drawing Sheets

U.S. PATENT DOCUMENTS

| | | | |
|---|---|---|---|
| 6,512,458 B1 * | 1/2003 | Kobayashi et al. | 340/635 |
| 6,593,853 B1 * | 7/2003 | Barrett et al. | 340/572.1 |
| 6,657,447 B1 * | 12/2003 | Parandoosh | 324/760 |
| 6,840,666 B2 * | 1/2005 | Enachescu et al. | 374/5 |
| 7,151,442 B1 * | 12/2006 | Nguyen | 340/428 |
| 7,154,283 B1 * | 12/2006 | Weakley et al. | 324/750 |
| 7,164,353 B2 * | 1/2007 | Puleston et al. | 340/514 |
| 7,225,992 B2 * | 6/2007 | Forster | 235/492 |

* cited by examiner

FIG.7

FLOW CHART OF SEQUENCE OF INCLUDED IN DEFECTIVE TAG DETECTION PROCESS SHIELDING PLATE CONTROL PROCESS

FIG.8A

DRAWINGS ILLUSTRATING MOUNTING OF TAG TESTING DEVICE

FIG.8B

TAG TESTING DEVICE, TAG TESTING METHOD, AND TAG TESTING PROGRAM

CROSS-REFERENCE TO RELATED APPLICATIONS

This application claims the benefit of Japanese Application No. 2005-094504, filed Mar. 29, 2005, in the Japan Patent Office, the disclosure of which is incorporated herein by reference.

BACKGROUND OF THE INVENTION

1. Field of the Invention

The present invention relates to a tag testing device, a tag testing method, and a tag testing program that detects a defective non-contact integrated circuit (IC) tag from a plurality of non-contact IC tags by exposing the non-contact IC tags to radio waves or electromagnetic waves. More particularly, the present invention relates to a tag testing device, a tag testing method, and a tag testing program that can increase the testing speed of the non-contact IC tags and can test the non-contact IC tags while being attached to a tag sheet.

2. Description of the Related Art

Conventionally, in a manufacturing process of radio frequency identification (RFID) tags (hereinafter, simply "tags"), the tags are tested by transmitting radio waves or electromagnetic waves (hereinafter, simply "radio waves") to each tag and confirming the tag response. In the aforementioned testing method, a device that transmits or receives the radio waves is placed inside a radio wave shield box (hereinafter, "shield box"), and each of the tags that are to be tested is sent one by one to the shield box to test whether the tag is non-defective. If the shield box is not used, a plurality of tags on the tag sheet receive the transmitted radio waves, and all of the tags that receive the radio waves respond to the radio waves. As a result, even with use of an anti-collusion function, a tag sheet location of a tag not functioning properly (hereinafter, "defective tag") cannot be identified.

In a tag manufacturing process, a large number of tags are formed on one sheet. However, when using the aforementioned tag testing method, the tags formed on each sheet (hereinafter, "tag sheet") are separated before each tag is tested. When testing a very large number of tags, tag testing needs to be carried out at a particularly high speed. Various methods of increasing the tag testing speed have been known.

For example, a technology to increase the tag testing speed is disclosed in U.S. Pat. No. 6,104,291, in which each of the tags to be tested is individually placed on a conveyor belt or a disk shaped rotating body, and each tag is sequentially sent to the shield box. However, since the technology disclosed in U.S. Pat. No. 6,104,291 uses a testing method in which tags are tested one by one, the testing speed can only be increased to a limited extent, even by increasing the speed of the conveyor belt or the rotating speed of the rotating body. In other words, the technology disclosed in U.S. Pat. No. 6,104,291 does not sufficiently increase the testing speed. Moreover, in the technology disclosed in U.S. Pat. No. 6,104,291, each tag needs to be separated from the tag sheet before testing. Thus, the tag sheet in the tag manufacturing process cannot be tested, if the tags are still attached to the tag sheet.

Thus, there is a requirement of a tag testing device that can increase the tag testing speed and test the tags while being attached to the tag sheet.

SUMMARY OF THE INVENTION

According to an aspect of the present invention, a tag testing device, a tag testing method, and a tag testing program are provided that can increase the tag testing speed and test the tags while being attached to the tag sheet.

Additional aspects and advantages of the invention will be set forth in part in the description which follows and, in part, will be obvious from the description, or may be learned by practice of the invention.

A tag testing device exposes a plurality of non-contact IC tags to radio waves or electromagnetic waves and detects defective IC tags from the non-contact IC tags, the tag testing device includes a transmitting unit that bulk transmits radio waves or electromagnetic waves to the non-contact IC tags, and a detecting unit that detects the defective IC tags based on whether the non-contact IC tags emit heat when the transmitting unit transmits radio waves or electromagnetic waves to the non-contact IC tags.

According to an aspect of the invention, the tag testing device further includes a recording unit that records a standard pattern representing a non-defective heat emission pattern of the non-contact IC tags, and an imaging unit that takes an image of a heat emission pattern of the non-contact IC tags that receive radio waves or electromagnetic waves transmitted by the transmitting unit, wherein the detecting unit compares the standard pattern recorded in the recording unit and the image of the heat emission pattern of the non-contact IC tags taken by the imaging unit to detect the defective IC tags.

According to an aspect of the invention, the tag testing device further includes a receiving unit that receives responses of the non-contact IC tags to radio waves or electromagnetic waves transmitted by the transmitting unit, a tag response counting unit that counts number of the defective IC tags based on the responses received by the receiving unit, and an image processing unit that counts number of the defective IC tags by analyzing the image of the heat emission pattern of the non-contact IC tags taken by the imaging unit, wherein the detecting unit determines absence of defective IC tags other than the defective IC tags that are detected based on the heat emission pattern of the non-contact IC tags, when the number counted by the tag response counting unit matches the number counted by the image processing unit.

According to an aspect of the invention, the tag testing device further includes a shielding unit that changes number of the non-contact IC tags that are to be tested by partially shielding a testing area that includes the non-contact IC tags by using a movable shielding mechanism, wherein the detecting unit instructs the shielding unit to change the number of non-contact IC tags that are to be tested, when the number counted by the tag response counting unit does not match the number counted by the image processing unit, and gradually excludes from the testing area a non-defective IC tag area wherein the number counted by the tag response counting unit matches the number counted by the image processing unit, to detect defective IC tags that emit heat but do not respond to radio waves or electromagnetic waves.

According to an aspect of the invention, the tag testing device further includes a printing unit that prints a label on the defective IC tag detected by the detecting unit to mark the defective IC tag as defective.

According to an aspect of the invention, the tag testing device further includes a cooling unit that cools a testing area that includes the non-contact IC tags that are to be tested.

A tag testing method of exposing a plurality of non-contact IC tags to radio waves or electromagnetic waves and detecting defective IC tags from the non-contact IC tags, bulk transmitting radio waves or electromagnetic waves to the non-contact IC tags, and detecting the defective IC tags based on whether the non-contact IC tags emit heat when radio waves or electromagnetic waves are transmitted to the non-contact IC tags at the transmitting process.

According to an aspect of the invention, the tag testing method further includes recording a standard pattern representing a non-defective heat emission pattern of the non-contact IC tags, and taking an image of a heat emission pattern of the non-contact IC tags that receive radio waves or electromagnetic waves transmitted at the transmitting process, wherein the detecting process includes comparing the standard pattern recorded at the recording process and the image of the heat emission pattern of the non-contact IC tags taken at the imaging process to detect the defective IC tags.

According to an aspect of the invention, the tag testing method further includes receiving responses of the non-contact IC tags to radio waves or electromagnetic waves transmitted at the transmitting process, counting number of the defective IC tags based on the responses received at the receiving process, and counting number of the defective IC tags by analyzing the image of the heat emission pattern of the non-contact IC tags taken at the imaging process, wherein the detecting process includes determining absence of defective IC tags other than the defective IC tags that are detected based on the heat emission pattern of the non-contact IC tags, when the number counted at the tag response counting process matches the number counted at the image processing process.

A computer readable medium storing at least one tag testing program to control a tag sheet testing apparatus according to a process of exposing a plurality of non-contact IC tags to radio waves or electromagnetic waves and detecting defective IC tags from the non-contact IC tags, bulk transmitting radio waves or electromagnetic waves to the non-contact IC tags, and detecting the defective IC tags based on whether the non-contact IC tags emit heat when radio waves or electromagnetic waves are transmitted to the non-contact IC tags during the bulk transmitting.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Reference will now be made in detail to the present embodiments of the present invention, examples of which are illustrated in the accompanying drawings, wherein like reference numerals refer to the like elements throughout. The embodiments are described below to explain the present invention by referring to the figures.

Radio waves or electromagnetic waves are bulk transmitted to non-contact Integrated Circuit (IC) tags (for example, radio frequency identification (RFID) tags) (hereinafter, simply referred to as "tags"), and the defective IC tags are detected based on whether the non-contact IC tags emit heat when radio waves or electromagnetic waves are transmitted to the non-contact IC tags. Because a large number of IC tags can be tested simultaneously by measuring simultaneously a heat emission status of each tag, tag testing speed can be increased and the tags can be tested while being attached to a tag sheet.

Further, a standard pattern representing a non-defective heat emission pattern of the non-contact IC tags are recorded, and an image of a heat emission pattern of the non-contact IC tags that receive radio waves or electromagnetic waves is taken, and the standard pattern recorded and the image of the heat emission pattern of the non-contact IC tags taken are compared to detect the defective IC tags. Because thermography is used, the tag testing speed can be increased and the tags can be tested while being attached to a tag sheet.

Further, responses of the non-contact IC tags to radio waves or electromagnetic waves transmitted are received, number of the defective IC tags based on the responses received are counted, and number of the defective IC tags are counted by analyzing the image of the heat emission pattern of the non-contact IC tags taken, and absence of defective IC tags other than the defective IC tags that are detected based oh the heat emission pattern of the non-contact IC tags is determined, when the number of defective IC tags counted based on the responses received matches the number of defective IC tags counted based on the analysis of the image of the heat emission pattern. Because the absence of the defective IC tags other than those detected by thermography is determined, reliability of defective IC tag detection can be enhanced.

According to an aspect of the invention, to determine absence of defective IC tags other than those detected by thermography, or to determine a position of a defective IC tag from among a plurality of IC tags only based upon bulk electromagnetic wave or radio wave transceiving status of the IC tags, or any combinations thereof, a number of the non-contact IC tags that are to be tested are changed by partially shielding a testing area that includes the non-contact IC tags by using a movable shielding mechanism, and an instruction is given to change the number of non-contact IC tags that are to be tested, when the number of defective IC tags counted based on the responses received does not match the number of defective IC tags counted based on the analysis of the image of the heat emission pattern, and a non-defective IC tag area wherein the number of defective IC tags counted based on the responses received matches the number of defective IC tags counted based on the analysis of the image of the heat emission pattern is gradually excluded from the testing area, to detect defective IC tags that emit heat but do not respond to radio waves or electromagnetic waves. Because a defective IC tag that cannot be detected by thermography is detected, reliability of defective IC tag detection can be enhanced.

According to an aspect of the invention, a position of a defective IC tag from among a plurality of IC tags can be determined only based upon bulk electromagnetic wave or radio wave transceiving status of the IC tags by gradually excluding from a tag testing area a non-defective IC tag area, according to a predetermined algorithm.

Further, a label is printed on the defective IC tag detected to mark the defective IC tag as defective. Therefore, in a manufacturing process, a defective IC tag can be easily recognized from among IC tags on a tag sheet.

Further, a testing area that includes the non-contact IC tags that are to be tested is cooled. Because the temperature of the testing area is prevented from increasing, accuracy of defective IC tag detection can be effectively enhanced.

Exemplary embodiments of a tag testing device, a tag testing method, and a tag testing program to test a plurality of tags formed on a tag sheet is explained next. However, the present invention is not limited to the present described example implementations of embodiment(s) of the present invention.

Figure 1:
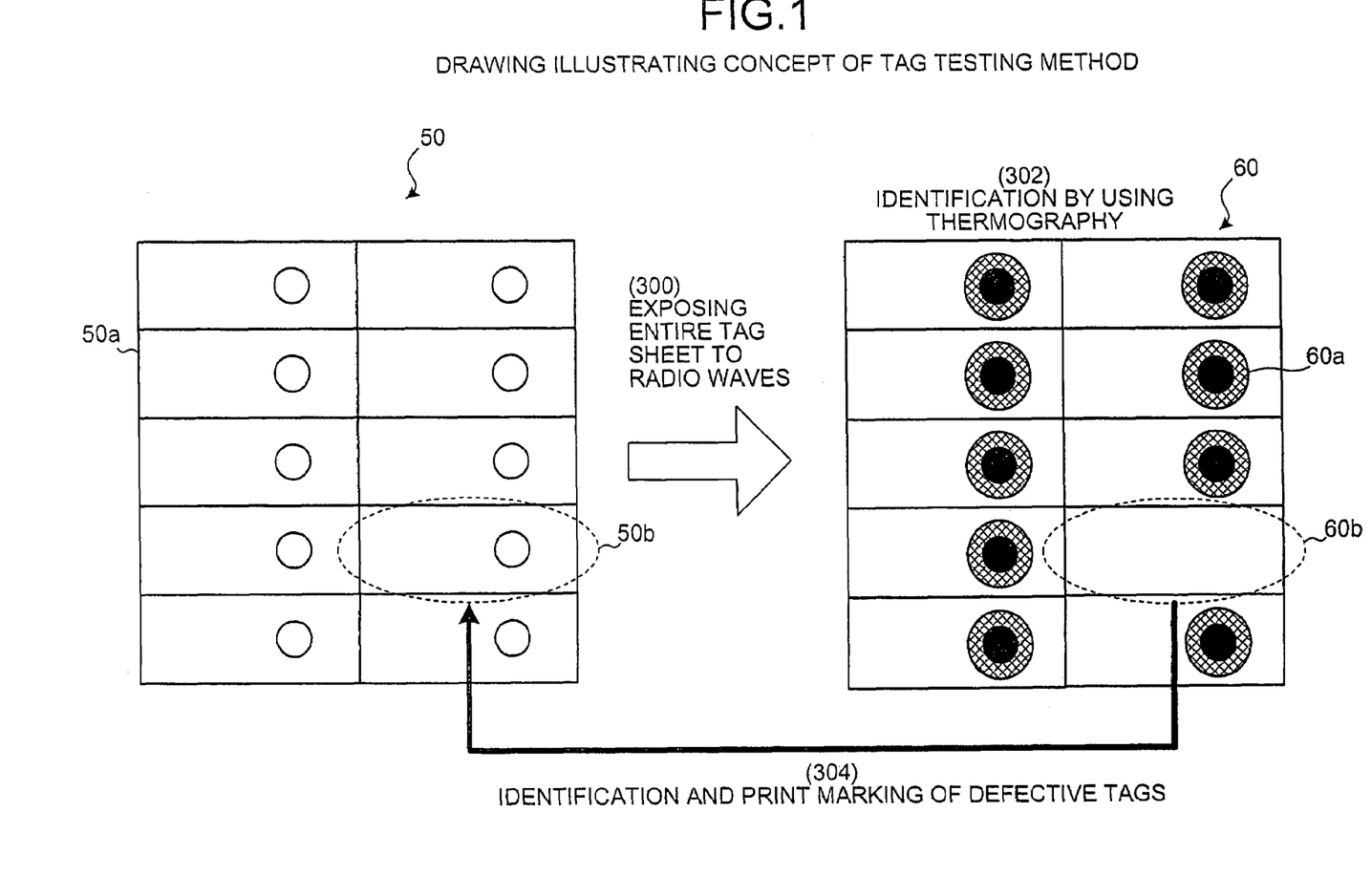
FIG. 1 is a drawing of a concept of a tag testing method according to the present invention, according to an embodiment of the present invention.

A tag testing method, which is the salient feature of the present invention, is explained first with reference to FIG. 1. FIG. 1 is a drawing of a concept of a tag testing method according to an embodiment the present invention. In the tag testing method according to the present invention, when radio waves are bulk transmitted to a tag sheet 50 that includes a tag 50a, the tag 50a receives the radio waves, is activated, and emits heat. Detecting heat emission of the tag 50a is the salient feature of the tag testing method according to the present invention. In other words, when a non-defective tag receives the radio waves, a power source generating unit included in the tag induces a voltage to activate a circuit, and the tag emits heat due to the voltage. However, a tag that is not properly activated, due to a defect in the circuit, (a defective tag) does not emit heat. Thus, defective tags can be efficiently detected from the tags formed on the tag sheet 50 by detecting whether the tags emit heat. According to an aspect of the invention, a conventional power source generator, such as a conventional tag circuit, included in a tag 50a can be used and/or a new or additional tag power source generator can be implemented/provided.

In FIG. 1, to be specific, at operation 300, the entire tag sheet 50 is exposed to the radio waves (see (300) of FIG. 1) and an image of the tag sheet 50 is taken by means of an infrared camera. At operation 302, the image is subjected to thermography to identify the defective tags (see (302) of FIG. 1). As shown in FIG. 1, reference numeral 60 denotes an image of the tag sheet 50 taken by the infrared camera. As shown in FIG. 1, a non-defective tag 60a shows a particular heat emission pattern due to heat emission from the circuit (see 60a of FIG. 1). However, a defective tag 60b does not show the heat emission pattern, because the tag circuit does not emit heat (60b of FIG. 1). Thus, at operation 304, as shown in FIG. 1, a tag 50b of the tag sheet 50 that corresponds to a tag as identified by reference symbol 60b of the image 60 can be identified as a defective tag 50b. According to an aspect of the invention, at operation 304, the identified defective tag 50b is also marked as defective by means of a printed label ((304) of FIG. 1), thereby clearly indicating defective tags on the tag sheet 50.

Taking an image of a tag sheet 50 with the infrared camera and detecting the defective tags by analyzing the image by means of thermography is explained in the present embodiment. However, according to another aspect of the invention, defective tags on the tag sheet 50 that do not emit heat may also be detected with a sensor that measures the temperature of each tag 50a on the tag sheet 50. For example, a conventional tag circuit voltage should generate or can emit measurable heat of approximately 60 Celsius.

In a conventional tag testing method, tags are sent one by one to a shield box and defective tags are detected by determining whether the tags respond to the radio waves transmitted by a radio wave transceiving device provided inside the shield box. Thus, the testing speed cannot be increased sufficiently. On the other hand, in the tag testing method according to the present invention, the defective tags are detected based on identification of whether each tag emits heat (hereinafter, "heat emission status"), thereby enabling to test a large number of tags simultaneously. Thus, the testing speed can be increased, and the tags formed on the tag sheet 50 can be bulk tested without separating each tag from the tag sheet 50.

Another aspect of the invention takes into consideration that there might be a defective tag that emits heat like a non-defective tag (i.e. a defective tag with a proper "heat emission status"), because the tag does not respond to the radio waves (i.e., does not activate properly). If such a non-activating tag can be detected as a defective tag when using the aforementioned tag testing method based on the heat emission status, the reliability and the accuracy of defective tag detection can be enhanced.

According to an aspect of the invention, a tag testing device bulk transmits the radio waves to the tag sheet 50, bulk receives the responses from each tag 50a by bulk reading the tags by using any known anti-collision function(s) to determine a bulk transceiving status of the tags, and combines the aforementioned tag testing method of the invention based on thermography to enhance the reliability and the accuracy of defective tag detection. Further, the tag testing device partially shields the tag sheet 50 with a movable shielding plate. Thus, by changing the shielding range, the tag testing device narrows down the possible defective tags on the tag sheet 50 and enhances the accuracy of defective tag detection by identifying a location of a defective tag 50b on the tag sheet 50.

Figure 2:
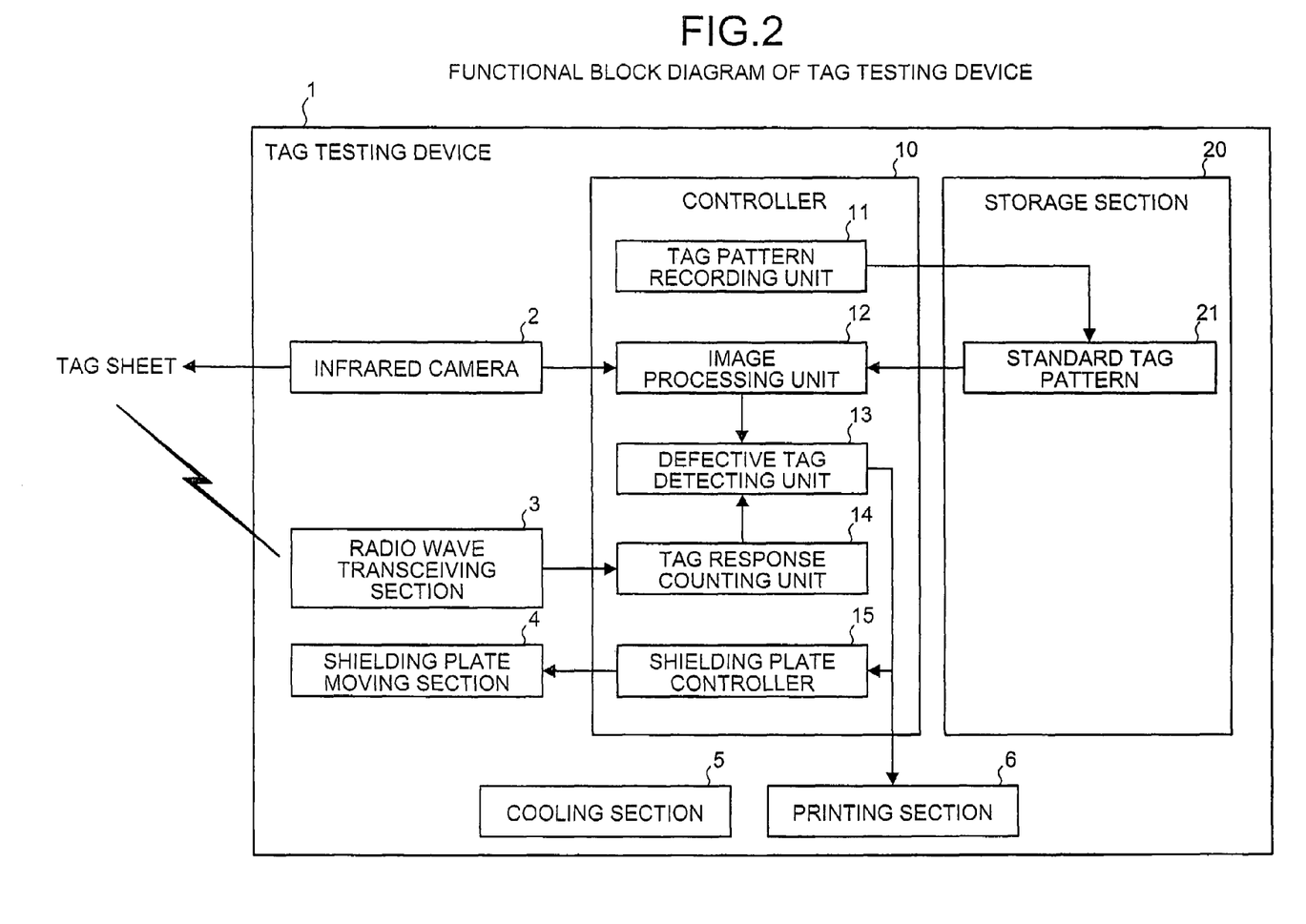
FIG. 2 is a functional block diagram of a tag testing device, according to an embodiment of the present invention.

A structure of the tag testing device that adopts the tag testing method according to the present invention is explained next with reference to FIG. 2. FIG. 2 is a functional block diagram of a tag testing device, according to an embodiment of the present invention. As shown in FIG. 2, a tag testing device 1 includes an infrared camera 2, a radio wave transceiving section 3, a shielding plate moving section 4, a cooling section 5, a printing section 6, a controller 10, and a storing section 20. The controller 10 further includes a tag pattern recording unit 11, an image processing unit 12, a defective tag detecting unit 13, a tag response counting unit 14, and a shielding plate controller 15. The storing section 20 further includes a standard tag pattern 21.

The infrared camera 2 takes an image of a tag sheet 50 that is to be tested, and provides image data to the image processing unit 12. The radio wave transceiving section 3 is a device that bulk transmits the radio waves to the tag sheet 50 and bulk receives the responses from the tags on the tag sheet 50. To be specific, the radio wave transceiving section 3 bulk reads the tags by using an anti-collision function, and provides an anti-collision function result to the tag response counting unit 14.

The shielding plate moving section 4 is a device that moves a movable shielding plate 8 (see FIGS. 8A and 8B) positioned between the infrared camera 2, the radio wave transceiving section 3, and the tag sheet 50. To be specific, the shielding plate moving section 4 shields a predetermined part of the tag sheet 50 from the infrared camera 2 and the radio wave transceiving section 3, based on instructions from the shielding plate controller 15. Further, the shielding plate 8 can be moved in a random direction on a surface parallel to the tag sheet. According to an aspect of the invention, the shield plate moving section 4 shields only the radio wave transceiving section 3.

Figure 8A:
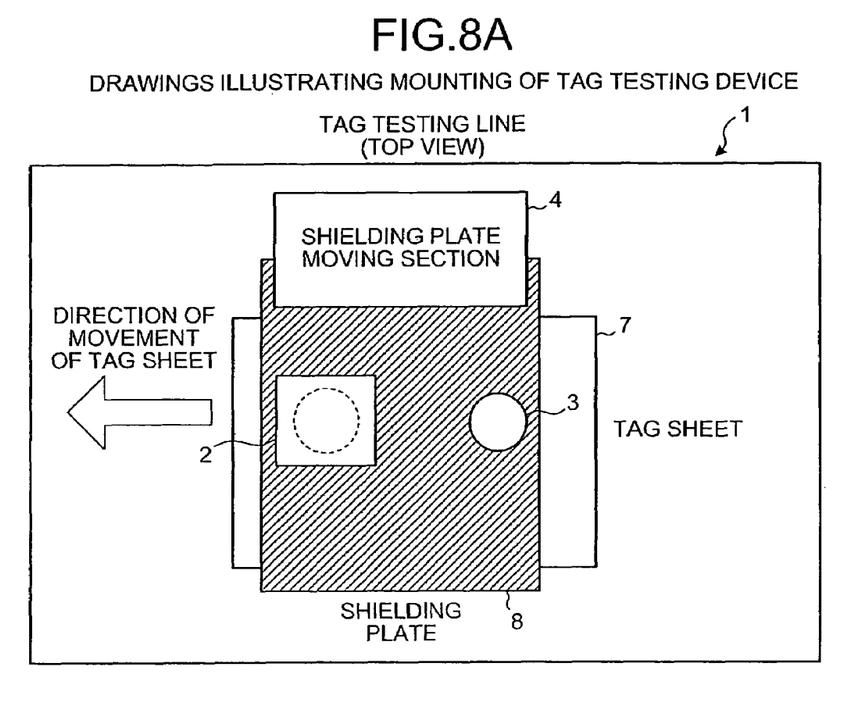
FIGS. 8A and 8B are drawings illustrating top and side views of a mounting of the tag testing device, according to an embodiment of the present invention.
Figure 8B:
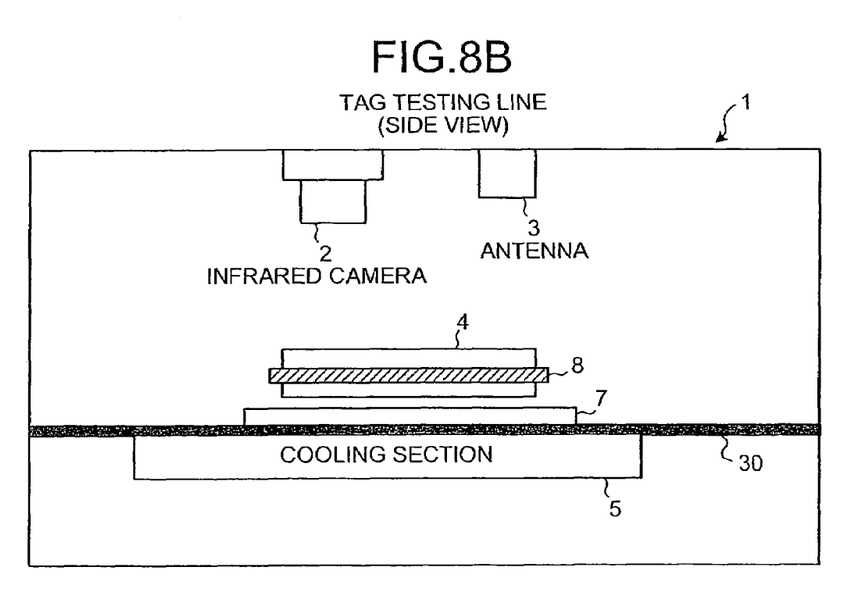

The shielding plate moving section 4 is explained with reference to FIGS. 8A and 8B. FIG. 8A illustrates a top view mounting of the tag testing device 1 and FIG. 8B is a side view mounting of the tag testing device 1. As shown in FIG. 8A, a "tag testing line" denotes a setup in which tag sheets 7 (50) to be tested are placed on a moving mechanism, such as a belt 30, and the tag sheets 7 (50) are successively sent (proceed or move on the belt 30) to an area in which the infrared camera 2 and the transceiver 3 are positioned to provide successive testing areas for the tag sheets 7 (50). For example, the tag sheet 7 progresses from right to left as a direction of movement as viewed in FIG. 8A.

When testing the tags, the tag sheet 7 is stopped at a position where the infrared camera 2 can take an image of the tag sheet 7, and radio waves are transmitted to the tag sheet 7 through the antenna (the radio wave transceiving unit) 3. Typically in the invention, a shielding plate 8 can move in a vertical and/or a horizontal direction on a surface parallel to the tag sheet 7, thereby shielding a predetermined part of the tag sheet 7. Moving the shielding plate 8 only in the vertical direction as viewed in FIG. 8B, and moving the infrared camera 2 and the tag sheet 7 together in the horizontal direction, on the surface parallel to the tag sheet 7, can produce the same result. The tags may also be tested by fixing the shielding plate 8 and moving the infrared camera 2 and the tag sheet 7 together in the vertical or the horizontal direction on a surface parallel to the tag sheet 7.

Returning to FIG. 2, the cooling section 5 is explained next. According to an aspect of the present invention, a cooling section 5 (see reference numeral 5 of FIG. 8B) is provided below the belt on which the tag sheet 7 (see reference numeral 7 of FIGS. 8A and 8B) is placed. The cooling section 5 maintains the temperature of the tag testing area(s) below the belt at a predetermined temperature by (in an unlimiting example) means of water-cooling pipes, etc., because some types of tags might emit less heat. When testing the tags that emit less heat, the change in the tag temperature might not be accurately assessed if the surrounding temperature changes, so the cooling section 5 maintains an appropriate tag testing area temperature. In other words, for example, if a tag sheet 7 (50) is cooler than room temperature, "heat emission status" determination can be improved when some tags might not generate enough heat or very little heat. Thus, changes in the temperature of the tag testing area can be prevented by using the cooling section 5, thereby enhancing the accuracy of testing. Water is used for cooling in the present embodiment. However, low temperature media other than water, such as liquid nitrogen, can also be used. Further, the present invention is not limited to the cooling section 5 configuration, and any apparatus and/or method to maintain an appropriate tag testing area, such as temperature maintenance, can be used. Further, the tag testing area might not be limited to an area below the belt, and any physical area of the tag testing device 1, or in which the tag testing device 1 is located, that can affect tag testing can be subject to proper maintenance, such as proper temperature maintenance, to implement "heat emission status" of the invention.

The printing section 6 prints a label on the defective tag 50b detected by the defective tag detecting unit 13 marking the tag 50a as a defective tag 50b on the tag sheet 7 (50). By providing the printing section 6, the defective tags 50b among the tags 50a on the tag sheet 50 can be marked for identification. Thus, the defective tags 50b can be easily identified in a tag manufacturing line and so forth. Further, the invention is not limited to label printing to identify tag sheet defective tags, and any apparatus and method can be used to readily identify defective tags 50b on a tag sheet 50.

The controller 10 detects the defective tags based on the image data taken by the infrared camera 2. As described in more detail herein, controller 10 can also enhance the reliability and the accuracy of defective tag detection with the aid of the radio wave transceiving section 3 and the shielding plate moving section 4.

The tag pattern recording unit 11 records beforehand, in the storing section 20, the heat emission pattern of the tag sheet, as the standard tag pattern 21. In a typical tag manufacturing process, a large number of tags are formed on a single tag sheet 7 (50). Therefore, by exposing a non-defective tag sheet 50 to the radio waves, and taking an image of the heat emission pattern of the tag sheet beforehand, the testing speed of a tag sheet moving on the tag testing line can be increased. Moreover, for example, by recording multiple heat emission patterns as the standard tag pattern 21, various types of tag sheets 50 can be tested by using a tag pattern 21 that corresponds to the type of the tag sheet 50 moving on the tag testing line.

The image processing unit 12 carries out image processing by comparing the image data 60 of the tag sheet 50 taken by the infrared camera 2 with the standard tag pattern 21 recorded beforehand in the storing section 20 by the tag pattern recording unit 11, and detects "defective tags" 60b according to a tag's 50a "heat emission status" (in unlimiting examples, a tag(s) 50 that do not emit heat, tag(s) that emit heat excessively (including insufficient heat emission, tag status based upon luminance data or other tag heat related emissive measurements), or any combinations thereof), based upon predetermined criteria, for example, thermography based comparison, temperature sensing based upon predetermined temperature ranges, etc. The image processing unit 12 informs the defective tag detecting unit 13 of the positions and the number of the defective tags based on the heat emission status, for example, identifying position(s) and a number of defective tags 60b, 50b. Although the described embodiment uses an infrared camera to determine a tag "heat emission status," the invention is not limited to such a configuration and the tag "heat emission status" can be determined based upon any other heat sensing techniques, such as (without limitation) a temperature sensor, etc.

The defective tag detecting unit 13 detects the defective tags with the aid of defective tag information received from the image processing unit 12, based on the "heat emission status" of tags on the tag sheet 50. In addition to the information received from the image processing unit 12, the defective tag detecting unit 13 also refers to a number of tag responses to the radio waves received from the tag response counting unit 14, to confirm absence of defective tags other than the defective tags already detected (i.e., to confirm or determine that there are no other possible defective or non-functioning tags, for example, based upon radio wave response). To detect (identify) the defective tags that emit heat but do not respond to the radio waves (for example, to identify location(s) of possible defective tags that emit heat on the tag sheet 7 (50)), the defective tag detecting unit 13 also changes the shielding range by partially shielding the tag sheet 7 with the movable shielding 8 plate, thereby narrowing down the possible defective tags.

A process to detect the defective tags with the defective tag information received from the image processing unit 12, based on the heat emission status, is explained first (see reference numeral 60 of FIG. 1). An image of the heat emission pattern of the tags in which all the tags on the tag sheet 50 properly emit heat is recorded as the standard tag pattern 21. For example, if the image indicated by the reference numeral 60 of FIG. 1 is the defective tag information received from the image processing unit 12 based on the heat emission status, the image 60 is compared with the standard tag pattern 21 so as to detect 60b as the defective tag. According to an aspect of the present invention the comparison process can be performed by the image processing unit 12, the defective tag detecting unit 13, or any combinations thereof. If all of the tags on a tag sheet 50 are of the same type, each tag shows the same heat emission pattern, and, thus, according to an aspect of the invention, in this case, it is possible to record only a heat emission pattern of a single tag as the standard tag pattern 21, and compare it with that of each tag on the tag sheet 50.

Figure 3:
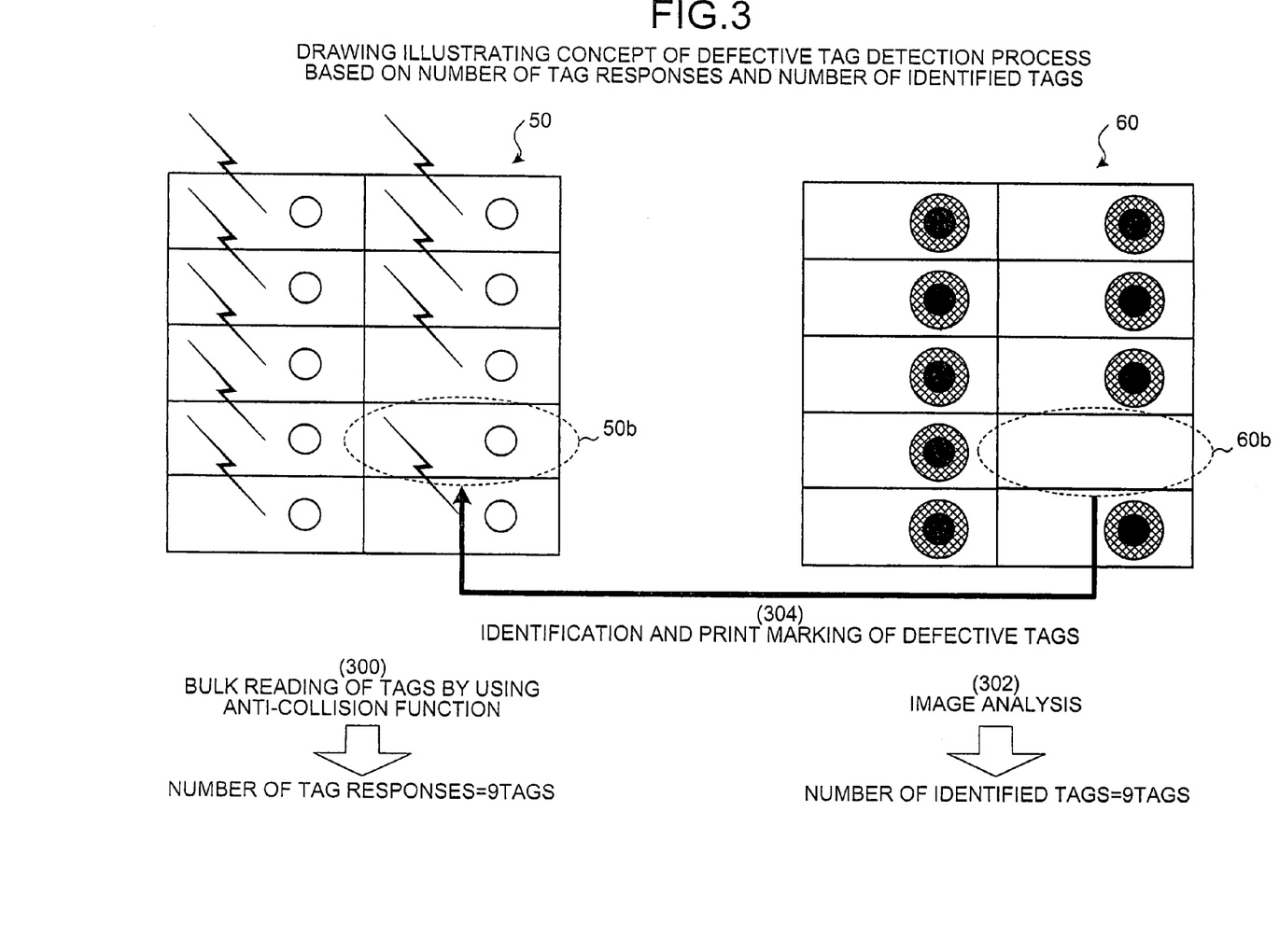
FIG. 3 is a drawing of a concept of a defective tag detection process based on a number of tag responses and a number of identified tags, according to an embodiment of the present invention.

Next, a process to confirm the absence of defective tags other than the defective tags detected from the defective tag information based on the heat emission status, is explained with reference to FIG. 3. FIG. 3 is a drawing of a concept of a defective tag detection process based on the number of tag responses to the radio waves and the number of tags identified as heat emitting tags, according to an embodiment of the present invention. As shown in FIG. 3, at operation 300, the defective tag detecting unit 13 receives the result of the bulk reading of the tags on the tag sheet 50 carried out by the tag response counting unit 14 by using the anti-collision function (see (300) of FIGS. 1 and 3). As shown in FIG. 3, the tag sheet 50 includes 10 tags out of which 9 tags respond to the transmitted radio waves. The tag response counting unit 14 informs the defective tag detecting unit 13 that the number of tag responses (number of non-defective tags) is 9. The tag 50b not responding to the radio waves is not yet identified at this point.

On the other hand, the defective tag detecting unit 13 also receives the defective tag information from the image processing unit 12 based on the heat emission status. As shown in FIG. 3, at operation 302, the image processing unit 12 identifies that the tag 60b does not emit heat as a result of image processing, and informs the defective tag detecting unit 13 that 9 tags are identified as non-defective tags by means of image analysis (see (302) of FIGS. 1 and 3). At operation 304, the defective tag detecting unit 13 identifies the tag 50b (the tag corresponding to the image data 60b) as the defective tag when the number of tags identified as heat emitting tags based on the heat emission status matches the number of tag responses to the radio waves, and, for example, instructs the printing section 6 to mark the tag 50b as the defective tag with a printed label (see (304) of FIGS. 1 and 3).

Thus, the absence of defective tags other than the defective tags detected by the heat emission status (i.e., defective tags other than the defective tags detected based upon the heat emission status) can be confirmed by also referring to the number of tag responses to the radio waves. The number of tag responses to the radio waves is obtained as a result of bulk reading of the tags by using the anti-collision function. Therefore, the reliability of the defective tag detection process is enhanced.

Figure 4:
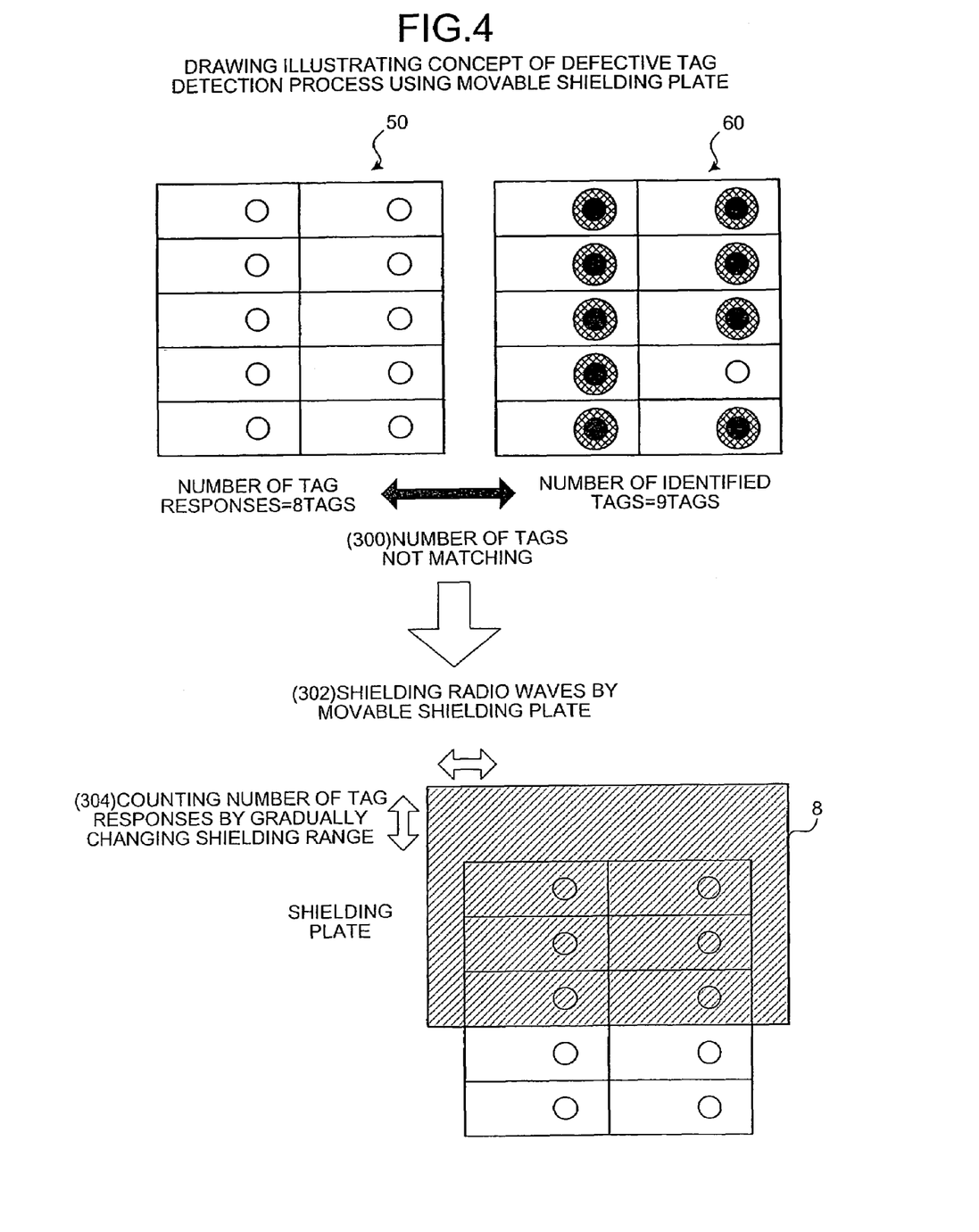
FIG. 4 is a drawing of a concept of the defective tag detection process using a movable shielding plate, according to an embodiment of the present invention.
Figure 5:
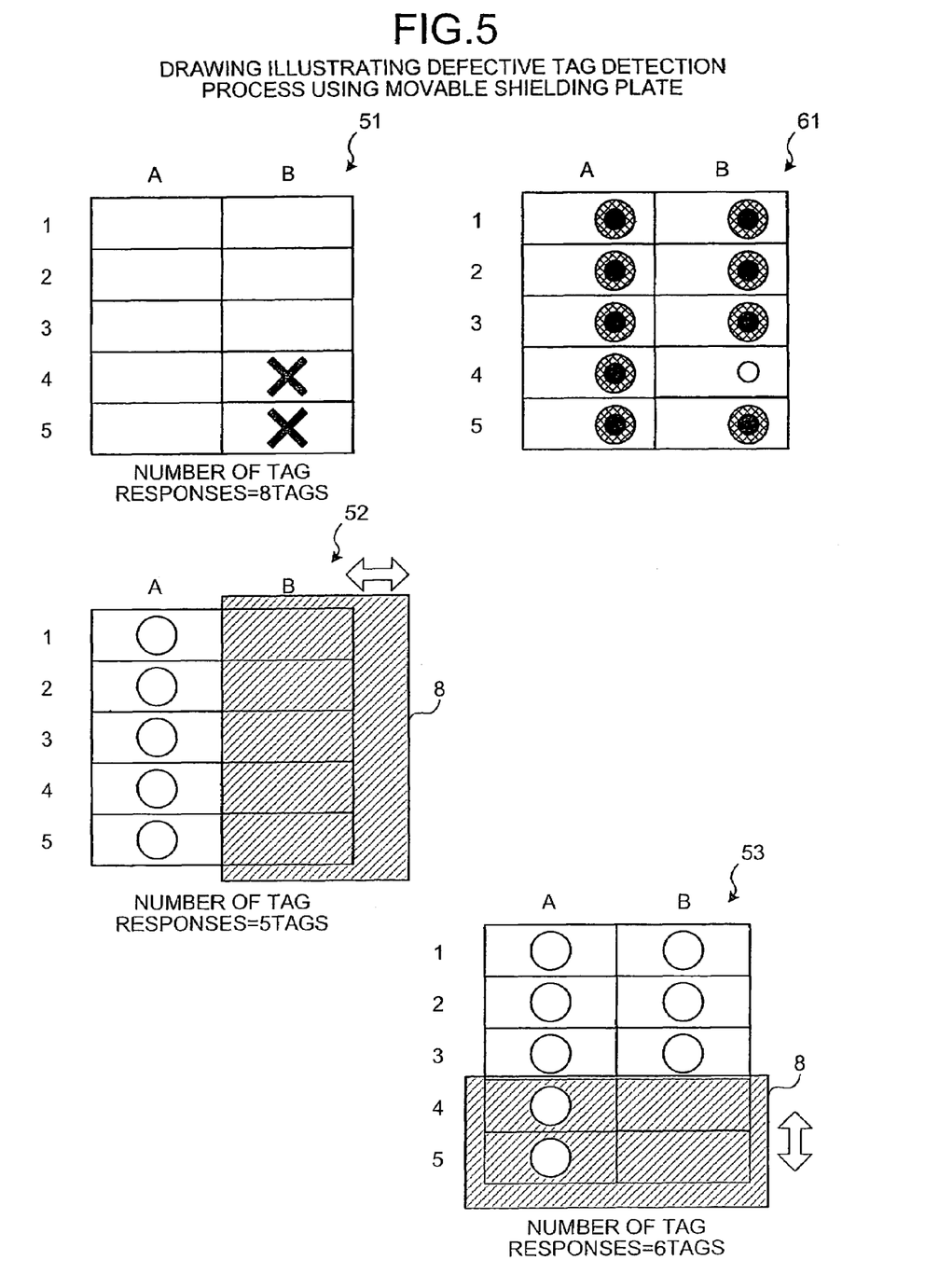
FIG. 5 is a drawing illustrating the defective tag detection process using the movable shielding plate, according to an embodiment of the present invention.

Next, a process is explained with reference to FIG. 4 and FIG. 5 which narrows down the possible defective tags by partially shielding the tag sheet and changing the shielding range with the movable shielding plate, to detect (identify) the defective tags that emit heat properly but do not respond to the radio waves. FIG. 4 is a drawing of a concept of the defective tag detection process using the movable shielding plate, according to an embodiment of the present invention. FIG. 5 is a drawing illustrating the defective tag detection process using the movable shielding plate, according to an embodiment of the present invention. More particularly, FIG. 4 is a drawing illustrating the defective tag detection process when the number of tag responses to the radio waves and the number of tags identified as heat emitting tags do not match. As shown in FIG. 4, at operation 300, the number of tag responses to the radio waves is 8 and the number of tags identified as heat emitting tags based on the heat emission status is 9 (see (300) of FIG. 4). This indicates the presence of a defective tag other than the defective tags detected by the heat emission status. In other words, there is a defective tag that emits heat properly, but does not respond to the radio waves, because of, for example, a partial defect in the tag's circuit.

At operation 302, tag sheet 7 (50) is partially shielded from the radio waves by moving the movable shielding plate 8 (see (302) of FIG. 4), and the number of tag responses is counted while gradually changing the shielding range (see (304) of FIG. 4). Thus, at operation 304, the possible position of defective tags can be narrowed down to detect the aforementioned defective tag that emits heat properly but fails to respond to radio waves. The process of narrowing down the possible defective tags is further explained in detail with reference to FIG. 5.

As shown in FIG. 5, 8 tags on a tag sheet 51 respond to the radio waves. A tag B-4 and a tag B-5 are the two defective tags. The tag B-4 is identified as a defective tag based on an image data 61. However, it is assumed that the tag B-5 is not yet identified as a defective tag. As shown in FIG. 5, tags B-1 through B-5 are shielded by moving the aforementioned movable shielding plate 8 in the horizontal direction (see reference numeral 52 of FIG. 5). In this state, bulk reading is performed by using the anti-collision function. As shown in FIG. 5, since tags A-1 through A-5 respond to the radio waves, the number of tag responses is 5, which matches the number of tags identified as heat emitting tags based on the heat emission status (see reference symbols A-1 through A-5 of reference numeral 61 of FIG. 5). Thus, the defective tag detecting unit 13 identifies the tags A-1 through A-5 as non-defective tags. In other words, the area including the tags A-1 through A-5 is identified as a non-defective tag area, and is excluded from the range of defective tag detection.

Next, the movable shielding plate 8 is moved in a vertical direction. As shown in FIG. 5, the shielding plate is moved to a position indicated by reference numeral 53 and the tags are bulk read by using the anti-collision function. The number of tag responses is 6, which matches the number of tags identified as heat emitting tags based on the heat emission status (see reference symbols A-1 through A-3 and B-1 through B-3 of reference numeral 61 of FIG. 5). Thus, the area including the tags B-1 through B-3 is identified as a non-defective tag area by the defective tag detecting unit 13 and is excluded from the range of defective tag detection.

As shown in FIG. 5, the tag sheet 51 includes 10 tags. When all the tags are bulk read by using the anti-collision function, the number of tag responses is 8, which means that the number of defective tags is 2. By the time the step indicated by reference numeral 53 of FIG. 5 is performed, the tags A-1 through A-5 and the tags B-1 through B-3 are identified as non-defective tags, which make up a total of 8 tags. Thus, the remaining tags B-4 and B-5 can be identified as the defective tags. Thus, by partially shielding the tag sheet 7(50) by using the movable shielding plate 8, the defective tags that emit heat properly but do not respond to the radio waves can be detected, thereby enhancing the accuracy of defective tag detection.

Returning to FIG. 2, the tag response counting unit 14 is explained next. The tag response counting unit 14 bulk reads the tags by using the anti-collision function with the aid of the radio wave transceiving section 3, and informs the defective tag detecting unit 13 of the number of tag responses to the radio waves. If the defective tag detecting unit 13 determines existence of defective tags other than the defective tags identified based upon tag heat emission status, the defective tag detecting unit 13 instructs the shielding plate controller 15 to control the shielding plate moving section 4 to change a number of the tags on the tag sheet that are to be tested by partially shielding a random area of the tag sheet by moving the shielding plate 8 and gradually excluding from the testing area a non-defective tag area wherein a number counted by the tag response counting unit 14 matches a number counted by the image processing unit 12, to detect such other defective tags.

The storing section 20 includes a storage device, such as a Random Access Memory (RAM), etc., that stores the standard tag pattern 21 recorded by the tag pattern recording unit 11. A single tag pattern or multiple tag patterns can be recorded as the standard tag pattern 21. As described earlier, in a typical tag manufacturing process, a large number of tags are formed on a single tag sheet 7 (50). Therefore, by exposing a non-defective tag sheet 7 (50) to the radio waves, and taking an image of the heat emission pattern of the tag sheet beforehand as a standard tag image pattern 21, the testing speed of a tag sheet moving on the tag testing line can be increased. Moreover, by recording multiple heat emission patterns as the standard tag pattern 21, various types of tag sheets can be tested by using a tag pattern that corresponds to the type of the tag sheet moving on the tag testing line.

Figure 6:
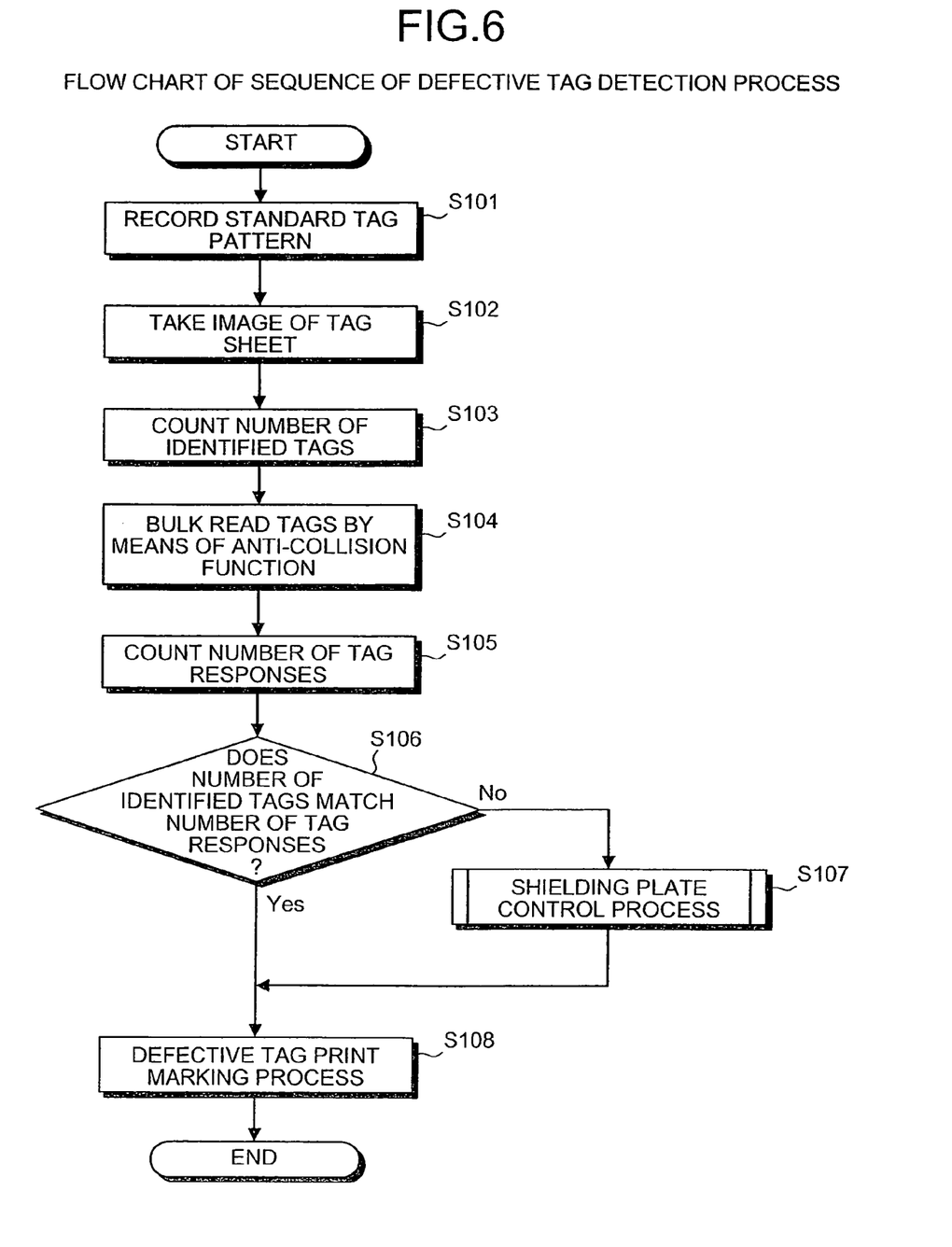
FIG. 6 is a flow chart of a sequence of the defective tag detection process, according to an embodiment of the present invention.

A sequence of the defective tag detection process based on the number of tag responses to radio waves and the number of tags identified as heat emitting tags (see FIG. 3) is explained with reference to FIG. 6. FIG. 6 is a flow chart of the sequence of the defective tag detection process, according to an embodiment of the present invention. As shown in FIG. 6, the tag pattern recording unit 11 records the standard tag pattern 21 in the storing section 20 (step S101). The infrared camera 2 takes an image of the tag sheet 7 (50) sent to the testing area (step S102). The image processing unit 12 compares the image data 60 of the tag sheet with the standard tag pattern 21 stored beforehand (step S103).

The radio wave transceiving section 3 bulk reads the tags of the tag sheet 7 (50) by using the anti-collision function (step S104), and the tag response counting unit 14 counts the number of the tag responses (step S105). Next, the defective tag detecting unit 13 determines whether the number of identified tags matches the number of tag responses (step S106). If the number of identified tags matches the number of tag responses ("Yes" at step S106), the defective tag detecting unit 13 instructs the printing section 6 to mark with a printed label the defective tags that are detected as a result of the image processing carried out by the image processing unit 12 (step S108), thereby ending the process.

Figure 7:
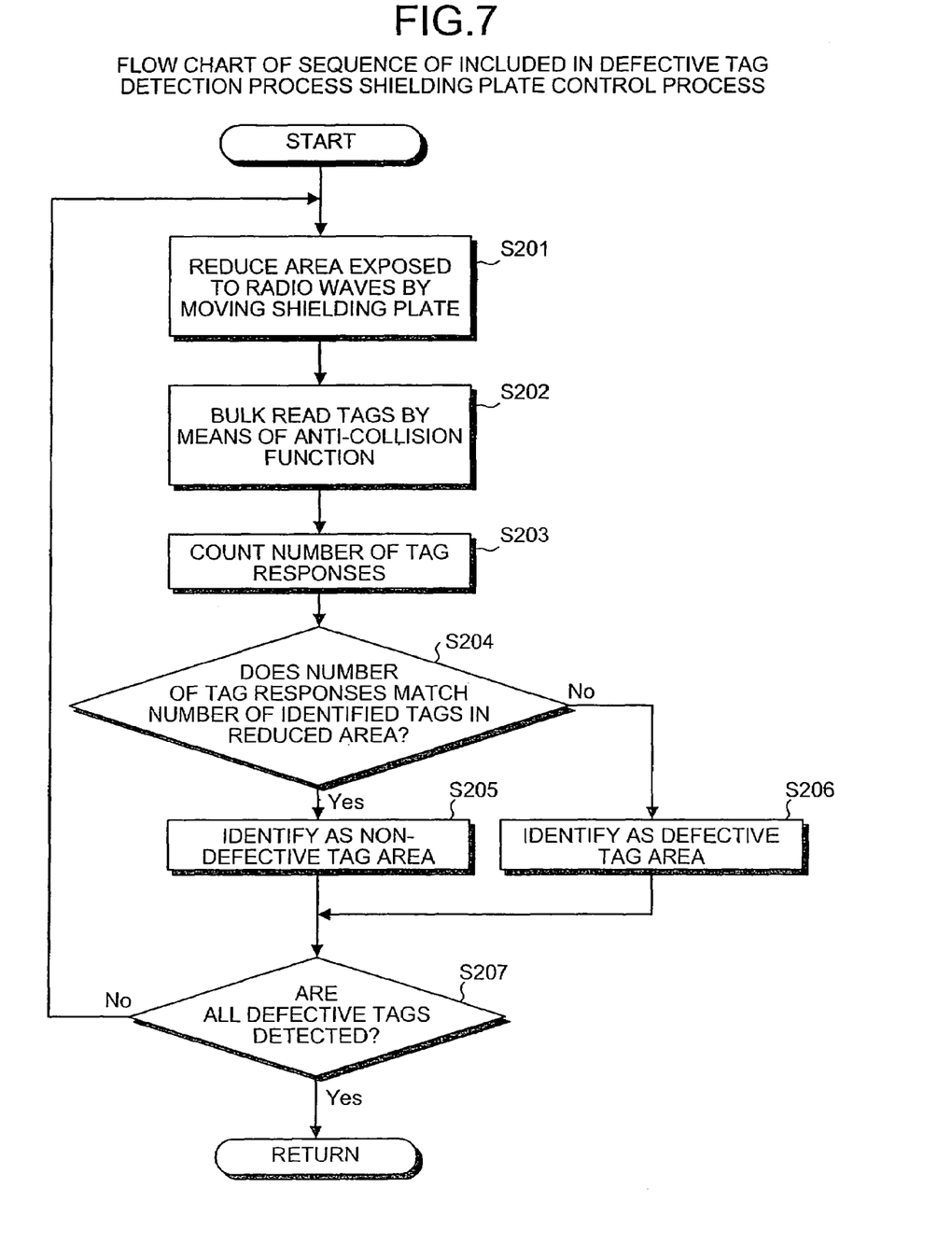
FIG. 7 is a flow chart of a sequence of the defective tag detection process using a shielding plate control process, according to an embodiment of the present invention.

If the number of identified tags does not match with the number of tag responses ("No" at step S106), the shielding plate controller 15 carries out a shielding plate control process (step S107), according to the unlimiting example process described with reference to FIGS. 4, 5 and 7. When the defective tags are finally identified, the printing section 6 carries out a defective tag marking process (step S108), thereby ending the process.

The shielding plate control process included in the defective tag detection process is explained with reference to FIG. 7. FIG. 7 is a flow chart of a sequence of the shielding plate control process included in the defective tag detection process, according to an embodiment of the present invention. The flow chart shown in FIG. 7 corresponds to the shielding plate control process (step S107) shown in FIG. 6. According to an aspect of the present invention, the shielding plate control process can be performed by the shielding plate controller 15, the defective tag detecting unit 13, or any combinations thereof. As shown in FIG. 7, the shielding plate controller 15 instructs the shielding plate moving section 4 to move the shielding plate 8 and partially shield the tag sheet 7 (50), thereby reducing the tag sheet test area exposed to the radio waves (step S201). The radio wave transceiving section 3 bulk reads the tags in the reduced tag sheet test area by using the anti-collision function (step S202). Next, the tag response counting unit 14 counts the number of tag responses (step S203). The defective tag detecting unit 13 determines whether the number of tag responses matches the number of identified tags in the reduced area. If the number of tag responses matches the number of identified tags in the reduced tag sheet test area ("Yes" at step S204), the defective tag detecting unit 13 identifies the tag sheet test area as a non-defective tag sheet test area (step S205) and excludes the non-defective tag sheet test area from the range of defective tag detection. If the number of tag responses does not match the number of identified tags in the reduced tag sheet test area ("No" at step S204), the defective tag detecting unit 13 identifies the tag sheet test area as the defective tag sheet test area (step S206).

Next, the defective tag detecting unit 13 determines whether all the defective tags are detected (step S207) and ends the defective tag detection process, if all the defective tags are detected ("Yes" at step S207). If all the defective tags are not identified (all the defective tags are not detected) ("No" at step S207), the defective tag detecting unit 13 continues to narrow down the possible defective tags by repeating the defective tag detection process from step S201 onwards until all defective tags have been detected. According to an aspect of the invention, at operation 201, any reducing area algorithm can be used. According to an aspect of the present invention, locations or positions of defective tags in a test area of a plurality of tags are identified according to "heat emission status" of the tags. According to another aspect of the invention, locations or positions of defective tags in a test area of a plurality of tags are identified according to a combination of "heat emission status" and bulk radio wave transceiving of the tags. According to another aspect of the present invention, tag sheet location(s) or position(s) of defective tags are identified according to a "heat emission status" of the tags or a combination of "heat emission status" and bulk radio wave transceiving of the tags, with respect to a test tag sheet.

According to the present embodiment, an image processing unit takes an image of a tag sheet 50 using an infrared camera 2, compares the image data 60 with a standard tag pattern image 21 stored in a storing section, and a defective tag detecting unit 13 detects defective tags on the tag sheet 50 based on the result of the comparison. Also, a radio wave transceiving section 3 bulk reads the tags on the tag sheet 50 using an anti-collision function. A tag response counting unit 14 counts the number of tag responses, and the defective tag detecting unit 13 compares the number of identified tags that are identified by the image processing unit with the number of tag responses. If the number of identified tags does not match the number of tag responses, a shielding plate controller 15 moves a shielding plate to shield the tag sheet 50 partially, and the radio wave transceiving section 3 repeatedly bulk reads the tags by using the anti-collision function while the shielding range is gradually changed, thereby narrowing down the possible defective tags that emit heat but do not respond to radio waves or electromagnetic waves. Thus, tag testing speed can be reliably increased, and tags can be tested without being separated from the tag sheet 50.

The present invention is not limited to testing tags that are attached to a tag sheet. For example, passive tags attached to a tag sheet can be simultaneously tested. For example, tags arranged in a predetermined sequence can be tested simultaneously. For example, non-passive or active tags arranged in a case can also be simultaneously tested. According to an aspect of the invention, passive tags, active tags, or any combinations thereof can be tested. Thus, tags can be tested simultaneously, thereby increasing the tag testing speed.

Functions of the tag testing device 1 according to the present invention were explained in the present embodiment. Each function of the tag testing device 1 can be provided in the form of a program executed by a computer, such as a personal computer or work station, as the case may be. In other words, each process explained in the present embodiment can be provided in the form of a program designed beforehand that is executed by a computer. The programs thus designed can be distributed via networks, such as the Internet. The programs may also be stored in computer readable storage media, such as a hard disk, a Flexible Disk (FD), a Compact Disk-Read Only Memory (CD-ROM), a Digital Versatile Disk (DVD) etc. and executed by reading from the storage media with the aid of a computer. More particularly, the tag testing device 1 can be implemented in software, programmable computing hardware, hardware/devices for processing information, including any forms of circuits, any forms of computer readable data storage media (for example, memory, hard disk, etc.), or apparatuses/hardware, including electromechanical, optical apparatuses or mechanisms, etc. (for example, an infrared camera, a shielding plate mover, a tag test area cooler, a printer, an electromagnetic spectrum wave, such as a radio wave transceiver, an electromagnetic spectrum wave, such as a radio wave, shield), or any combinations thereof. According to an aspect of the present invention a tag test device controller 10 of the tag testing device 1 can be implemented in software.

Accordingly, the present invention can provide a tag testing device that exposes a plurality of non-contact integrated circuit (IC) radio frequency tags (for example, radio frequency identification (RFID) tags) to radio waves or electromagnetic waves and detects defective IC tags from the non-contact IC tags, the tag testing device comprising a transceiver that bulk transmits radio waves or electromagnetic waves to the non-contact IC tags; and a detector that detects the defective IC tags based on whether the non-contact IC tags emit heat when the transceiver transmits radio waves or electromagnetic waves to the non-contact IC tags. The tag testing device further comprises a tag pattern image recorder that records a standard tag pattern image representing a non-defective heat emission pattern of non-contact IC tags; and a camera that takes an image of a heat emission pattern of the non-contact IC tags that receive radio waves or electromagnetic waves transmitted by the transceiver, wherein the detector compares the recorded standard tag pattern image and the image of the heat emission pattern of the non-contact IC tags taken by the camera to detect the defective IC tags. Further, the transceiver receives responses of the non-contact IC tags to radio waves or electromagnetic waves transmitted by the transceiver, the detector counts a number of the defective IC tags based on the received responses and the detector determines absence of defective IC tags other than the defective IC tags that are detected based on the heat emission pattern of the non-contact IC tags, when the number of responsive tags matches a number of heat emitter tags.

The tag testing device further comprises a movable shield that changes a number of the non-contact IC tags that are to be tested by partially shielding a testing area that includes the non-contact IC tags, wherein the detector instructs the moveable shield to change the number of non-contact IC tags that are to be tested, when a number responsive tags does not match a number of heat emitter tags, and the moveable shield gradually excludes from the testing area a non-defective IC tag area wherein the number of responsive tags matches the number of heat emitter tags, to detect defective IC tags that emit heat but do not respond to radio waves or electromagnetic waves.

The tag testing device further comprises a defective tag marker that labels as defective a defective IC tag detected by the detector. The tag testing device further comprises a cooler that cools a testing area that includes the non-contact IC tags that are to be tested.

A tag testing method of exposing a plurality of non-contact IC tags to radio waves or electromagnetic waves and detecting defective IC tags from the non-contact IC tags, the method comprising bulk transmitting radio waves or electromagnetic waves to the non-contact IC tags; and detecting the defective IC tags based on whether the non-contact IC tags emit heat when radio waves or electromagnetic waves are transmitted to the non-contact IC tags. The tag testing method further comprises recording a standard pattern image representing a non-defective heat emission pattern of the non-contact IC tags; and taking an image of a heat emission pattern of the non-contact IC tags that receive the transmitted radio waves or electromagnetic waves , wherein the detecting process includes comparing the recorded standard pattern image and the taken image of the heat emission pattern of the non-contact IC tags to detect the defective IC tags.

The tag testing method further comprises receiving responses of the non-contact IC tags to the transmitted radio waves or electromagnetic waves; counting a number of the defective IC tags based on the responses received; and counting a number of the defective IC tags by analyzing the taken image of the heat emission pattern of the non-contact IC tags, wherein the detecting includes determining absence of defective IC tags other than the defective IC tags that are detected based on the heat emission pattern of the non-contact IC tags, when a number of responsive tags matches a number of heat emitting tags.

The tag testing method further comprises changing a number of the non-contact IC tags that are to be tested by partially shielding a testing area that includes the non-contact IC tags, wherein the detecting includes instructing to change the number of non-contact IC tags that are to be tested, when the number of responsive tags does not match the number heat emitting tags, and gradually excluding from the testing area a non-defective IC tag area wherein a number of responsive tags matches a number of heat emitting tags, to detect defective IC tags that emit heat but do not respond to radio waves or electromagnetic waves.

The tag testing method further comprises marking a defective IC tag detected at the detecting. The tag testing method further comprises cooling a testing area that includes the non-contact IC tags that are to be tested.

A tag testing program of exposing a plurality of non-contact IC tags to radio waves or electromagnetic waves and detecting defective IC tags from the non-contact IC tags, wherein the program causes a computer to execute bulk transmitting radio waves or electromagnetic waves to the non-contact IC tags; and detecting the defective IC tags based on whether the non-contact IC tags emit heat when radio waves or electromagnetic waves are transmitted to the non-contact IC tags. The tag testing program further causes a computer to record a standard pattern image representing a non-defective heat emission pattern of the non-contact IC tags; and to take an image of a heat emission pattern of the non-contact IC tags that receive the transmitted radio waves or electromagnetic waves, wherein the detecting includes comparing the recorded standard pattern and the taken image of the heat emission pattern of the non-contact IC tags to detect the defective IC tags.

The tag testing program further causes a computer to receive responses of the non-contact IC tags to the transmitted radio waves or electromagnetic waves; counting a number of the defective IC tags based on the responses received; and counting a number of the defective IC tags by analyzing the taken image of the heat emission pattern of the non-contact IC tags, wherein the detecting includes determining absence of defective IC tags other than the defective IC tags that are detected based on the heat emission pattern of the non-contact IC tags, when a number of responsive tags matches a number of heat emitting tags.

The tag testing program further causes a computer to control changing a number of the non-contact IC tags that are to be tested by partially shielding a testing area that includes the non-contact IC tags by using a movable shielding mechanism, wherein the detecting includes instructing the movable shielding mechanism to change the number of non-contact IC tags that are to be tested, when the number of responsive tags does not match the number of heat emitting tags, and gradually excluding from the testing area a non-defective IC tag area wherein a number of responsive tags matches a number of heat emitting tags, to detect defective IC tags that emit heat but do not respond to radio waves or electromagnetic waves.

As described above, a tag testing device, a tag testing method, and a tag testing program according to the present invention is applicable in testing a large number of non-contact IC tags at high speed. The present invention is particularly applicable when a large number of the non-contact IC tags need to be tested at high speed while being attached to a tag sheet, in (during) a manufacturing process of the non-contact IC tags. A tag testing device uses an infrared camera to take an image of a plurality of radio frequency identification tags, compares the image with a stored standard tag pattern image, and detects defective tags based on the comparison. A radio wave transceiver bulk reads the tags using an anti-collision function, a tag response counter counts a number of tag responses, and a defective tag detector compares a number of heat emitting tags based upon the image processing with a number of tag responses counted by the tag response counter. If a number of heat emitting tags does not match a number of responsive tags, a number of the tags tested are changed by partially shielding the tags and the radio wave transceiver repeatedly bulk reads the tags on the tag sheet using the anti-collision function while a shielding range is gradually changed, thereby narrowing down other possible defective but heat emitting tags.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A tag testing device that exposes a plurality of non-contact IC tags to radio waves or electromagnetic waves and detects defective IC tags from the non-contact IC tags, the tag testing device comprising:
    a transmitting unit that bulk transmits radio waves or electromagnetic waves to the non-contact IC tags; and
    a detecting unit that detects defective non-contact IC tags according to a combination of heat emission status and the bulk radio waves or electromagnetic waves transceiving status of the non-contact IC tags.

2. The tag testing device according to claim 1, further comprising:
    a recording unit that records a standard pattern image representing a non-defective heat emission pattern of the non-contact IC tags; and
    an imaging unit that takes an image of a heat emission pattern of the non-contact IC tags that receive radio waves or electromagnetic waves transmitted by the transmitting unit, wherein
    the detecting unit compares the standard pattern image recorded in the recording unit and the image of the heat emission pattern of the non-contact IC tags taken by the imaging unit to detect the defective IC tags.

3. The tag testing device according to claim 2, further comprising:
    a receiving unit that receives responses of the non-contact IC tags to radio waves or electromagnetic waves transmitted by the transmitting unit;
    a tag response counting unit that counts number of the defective IC tags based on the responses received by the receiving unit; and
    an image processing unit that counts a number of the defective IC tags by analyzing the image of the heat emission pattern of the non-contact IC tags taken by the imaging unit, wherein
    the detecting unit determines absence of defective IC tags other than the defective IC tags that are detected based on the heat emission pattern image of the non-contact IC tags, when a number counted by the tag response counting unit matches the number counted by the image processing unit.

4. The tag testing device according to claim 3, further comprising
    a shielding unit that changes a number of the non-contact IC tags that are to be tested by partially shielding a testing area that includes the non-contact IC tags by using a movable shielding mechanism, wherein
    the detecting unit instructs the shielding unit to change the number of non-contact IC tags that are to be tested, when the number counted by the tag response counting unit does not match the number counted by the image processing unit, and gradually excludes from the testing area a non-defective IC tag area wherein the number counted by the tag response counting unit matches the number counted by the image processing unit, to detect defective IC tags that emit heat but do not respond to radio waves or electromagnetic waves.

5. The tag testing device according to any one of claims 1 to 4, further comprising a printing unit that prints a label on the defective IC tag detected by the detecting unit to mark the defective IC tag as defective.

6. The tag testing device according to any one of claims 1 to 4, further comprising a cooling unit that cools a testing area that includes the non-contact IC tags that are to be tested.

7. A method, comprising:
    determining heat emission status of a plurality of non-contact integrated circuit (IC) tags when bulk transmitting electromagnetic waves or radio waves to the tags;
    determining bulk electromagnetic wave or radio wave transceiving status of the tags; and
    detecting defective tags by identifying one or more positions of defective tags in a test area of the plurality of tags, according to a combination of heat emission status and the bulk electromagnetic wave or radio wave transceiving status.

8. The tag testing method according to claim 7, further comprising:
recording a standard pattern representing a non-defective heat emission pattern of the non-contact IC tags; and
taking an image of a heat emission pattern of the non-contact IC tags that receive the transmitted radio waves or electromagnetic waves, wherein
the detecting includes comparing the recorded standard pattern recorded and the taken image of the heat emission pattern of the non-contact IC tags to detect the defective IC tags.

9. The tag testing method according to claim 8, further comprising:
receiving responses of the non-contact IC tags to the transmitted radio waves or electromagnetic waves;
counting a number of the defective IC tags based on the responses received; and
counting a number of the defective IC tags by analyzing the taken image of the heat emission pattern of the non-contact IC tags, wherein
the detecting includes determining absence of defective IC tags other than the defective IC tags that are detected based on the heat emission pattern of the non-contact IC tags, when the number counted at the tag response counting matches the number counted by analyzing the taken image.

10. An apparatus performing the method of claim 7.

11. The method according to claim 7, wherein the determining of the heat emission status comprises thermography, temperature sensing, luminance, or any combinations thereof of a plurality of non-contact integrated circuit (IC) tags and detecting a defective tag from among the plurality of tags based upon the heat emission status when transmitting electromagnetic waves or radio waves to the tags.

12. A tag testing program of exposing a plurality of non-contact IC tags to radio waves or electromagnetic waves and detecting defective IC tags from the non-contact IC tags, wherein the program causes a computer to execute:
bulk transmitting radio waves or electromagnetic waves to the non-contact IC tags; and
detecting the defective IC tags according to a combination of heat emission status and the bulk radio waves or electromagnetic waves transceiving status of the non-contact IC tags.

13. An apparatus, comprising:
an infrared camera to take an image of a plurality of non-contact integrated circuit (IC) tags; and
a controller to simultaneously test the plurality of non-contact IC tags according to a combination of heat emission status detected based on the taken image and bulk electromagnetic wave or radio wave transceiving status of the non-contact IC tags.

14. The apparatus of claim 13, wherein the controller determines the heat emission status according to thermography by comparing the infrared camera image of the tags with a stored tag pattern image of functioning tags to detect a defective tag.

15. The apparatus of claim 14, wherein the controller bulk reads the tags using an anti-collision function, counts a number of tag responses, and compares a number of heat emitting tags based upon the heat emission status of the tags with a number of tag responses, to detect a position of the non-active tag with a proper heat emission status as the defective tag.

16. The apparatus of claim 15, further comprising:
a shield,
wherein, if the number of heat emitting tags does not match the number of responsive tag, the controller controls the shield to gradually change a tag test area exposed to the electromagnetic waves or radio waves and repeatedly bulk reads the tags using the anti-collision function to narrow down the position of the non-active tag with proper heat emission status as the defective tag.

17. The apparatus of claim 13, wherein the tags are passive radio frequency identification (RFID) tags on a tag sheet, encased active RFID tags, or any combinations thereof.

18. The apparatus of claim 13, wherein the heat emission status comprises a status based upon whether a tag fails to emit heat, emits excessive heat, emits insufficient heat, or any combinations thereof.

19. The apparatus of claim 18, wherein the controller determines the heat emission status according to thermography, temperature sensing, luminance, or any combinations thereof.

20. The apparatus of claim 16, wherein the shield is a movable shield movable in a random direction on a surface parallel to the tag test area, according to instructions from the controller.

21. The apparatus of claim 14, further comprising:
a computer readable medium storing a plurality of tag pattern images of functioning different type tags,
wherein the controller tests a plurality of different type tags according to thermography based upon the tag pattern images of functioning different type tags, to detect a defective tag.

22. An apparatus, comprising:
means for detecting a defective non-contact integrated circuit (IC) tag from among a plurality of non-contact IC tags according to a combination of heat emission status and bulk electromagnetic wave or radio wave transceiving status of the non-contact IC tags.

23. The apparatus of claim 22, further comprising:
means for detecting a position of a non-active tag with a proper heat emission status, as the defective tag.

* * * * *